United States Patent
Petranovic et al.

[19]

[11] Patent Number: 6,109,201
[45] Date of Patent: Aug. 29, 2000

[54] RESYNTHESIS METHOD FOR SIGNIFICANT DELAY REDUCTION

[75] Inventors: Dusan Petranovic, Cupertino; Ranko Scepanovic, San Jose, both of Calif.; Stanislav V. Aleshin; Mikhail Grinchuk, both of Moskow, U.S.S.R.; Sergei Gashov, Moskow, U.S.S.R.

[73] Assignee: LSI Logic Corporation, Milpitas, Calif.

[21] Appl. No.: 09/010,395

[22] Filed: Jan. 21, 1998

[51] Int. Cl.[7] .................................................. G06F 17/50
[52] U.S. Cl. ................................................ 116/21; 716/10
[58] Field of Search ........................................ 395/500.03

[56] References Cited

U.S. PATENT DOCUMENTS

| | | | |
|---|---|---|---|
| 5,077,676 | 12/1991 | Johnson et al. | 364/489 |
| 5,396,435 | 3/1995 | Ginetti | 364/489 |
| 5,426,591 | 6/1995 | Ginetti et al. | 364/489 |
| 5,598,344 | 1/1997 | Dangelo et al. | 364/489 |
| 5,666,290 | 9/1997 | Li et al. | 364/491 |
| 5,726,902 | 3/1998 | Mahmood et al. | 364/489 |
| 5,751,596 | 5/1998 | Ginetti et al. | 364/491 |
| 5,764,525 | 6/1998 | Mahmood et al. | 364/488 |
| 5,801,958 | 9/1998 | Dangelo et al. | 364/489 |
| 5,854,752 | 12/1998 | Agarwal | 364/489 |

OTHER PUBLICATIONS

Saldanha, A.; Brayton, R.K.; Sangiovanni–Vincentelli, A.L., Circuit Structure Relations to Redundancy and Delay, Computer–Aided Design of Integrated Circuits and Systems, IEEE Transaction on, pp. 875–883, Jul. 1994.

Chen, H.C.–C; DU,D.H.–C.; Liu, L.–R., Critical Path Selection For Performance Optimization, Computer–Aided Design of Integrated Circuits and Systems, IEEE Transactions on, pp. 185–195, Feb. 1993.

Yoshikawa, Ko et al., Timing Optimization on Mapped Circuits, Proceedings of the 28th conference on ACM/IEEE Design Automation Conference, pp. 112–117, Jul. 1991.

Keutzer, Kurt et al., Is Redundancy Necessary to Reduce Delay, IEEE Transaction On Computer–Aided Design, pp. 427–435, Apr. 1991.

Nishio, S. et al. Incremental Timing Optimization During Multiple Stages of Logic Synthesis, ASIC Conference and Exhibit, 1991. Proceedings., Fourth Annual IEEE International, pp. P13–1.1–P13–1.4, Sep. 1991.

*Primary Examiner*—Paul R. Lintz
*Assistant Examiner*—A. M. Thompson
*Attorney, Agent, or Firm*—Mitchell, Silberberg & Knupp LLP

[57] ABSTRACT

Integrated circuit chips (IC's) require proper placement of many cells (groups of circuit components) and complex routing of wires to connect the cells. Designing of the IC's require meeting real-world constraints one of which is the performance of the IC, or the period of time required by the integrated circuit to produce the output signals from the time the input signals are available. Typically, the performance of an integrated circuit is determined by the slowest path of the signals, called the critical path. The critical path is usually only a small portion of the IC. The present invention discloses a method and apparatus for transforming the circuits comprising the critical path, thereby increasing the performance of the entire IC. The transformation is performed by segmenting, or blocking, the cells which make up the critical path. Then, each block is transformed, or replaced, with a resynthesized circuit to which both the digital 0 and digital 1 values are provided. The critical path is defined by the fact that the delay at each block is accumulated because each block has to wait for the output signal of the preceding block to use as its input signal. After the resynthesis of the blocks, none of the blocks need to wait for the output signal of its preceding block because each of the resynthesized blocks has the output for all possible inputs values (0 and 1). Thus, the signal delay at each block is not accumulated; rather, the only accumulated delay is the delay of the multiplexors used to select the correct output. The result is a dramatically reduced critical path delay.

17 Claims, 4 Drawing Sheets

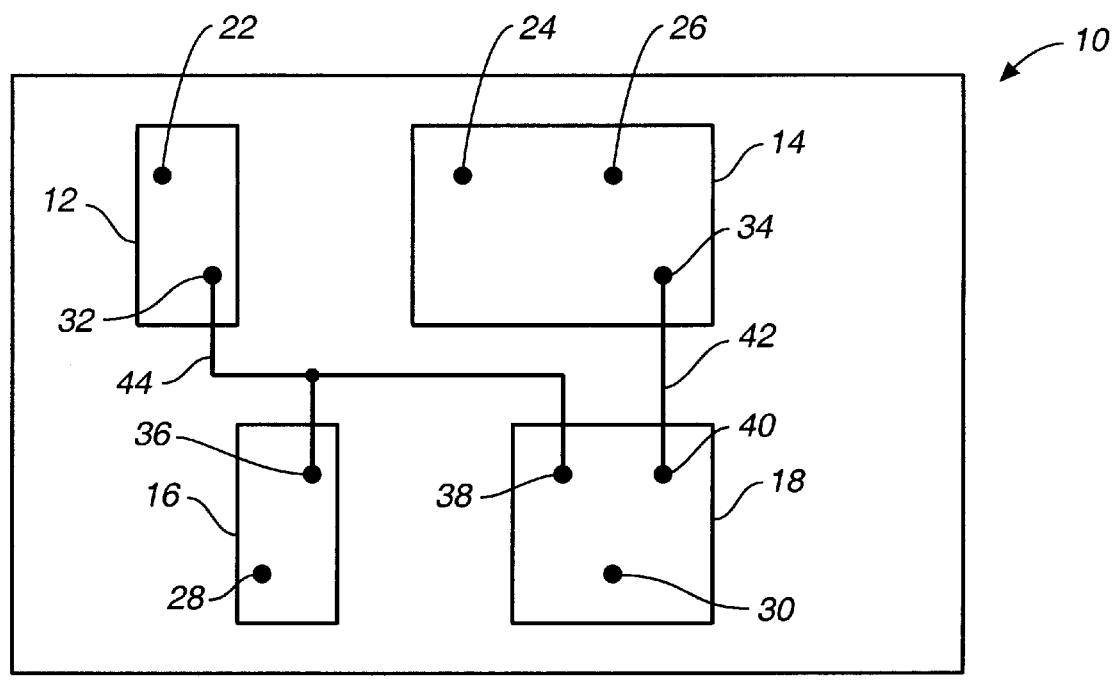
FIG._1A
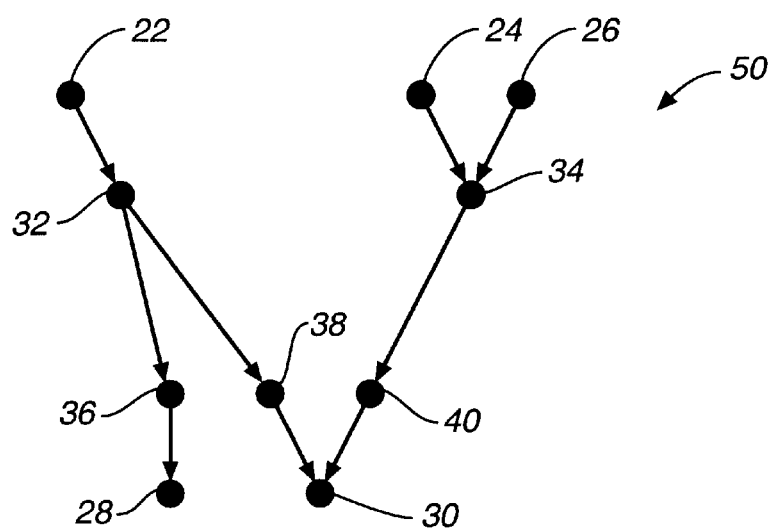
FIG._1B

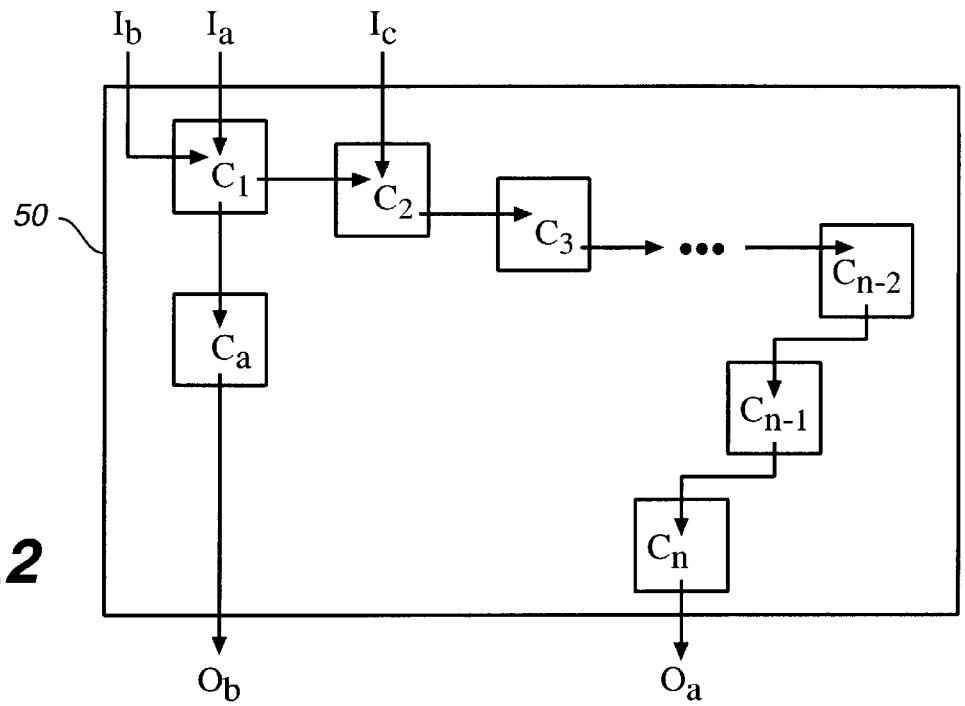
FIG._2
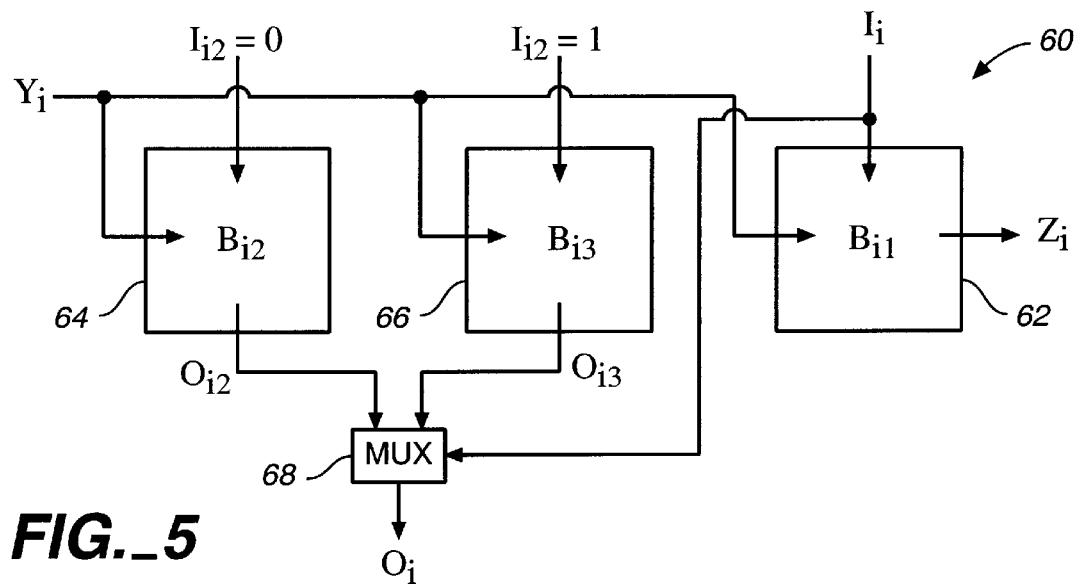
FIG._5
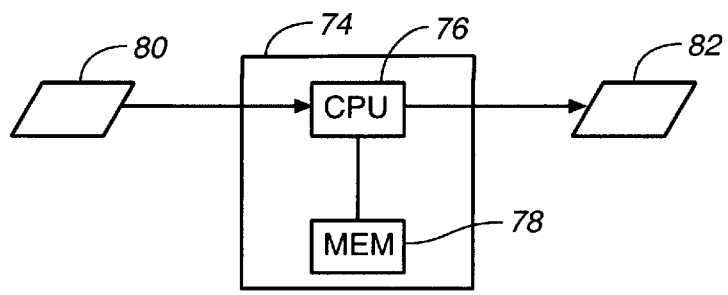
FIG._7

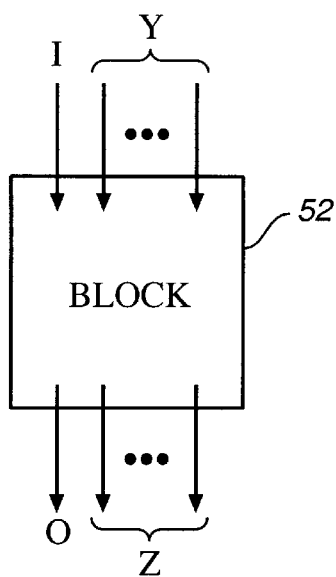
FIG._3
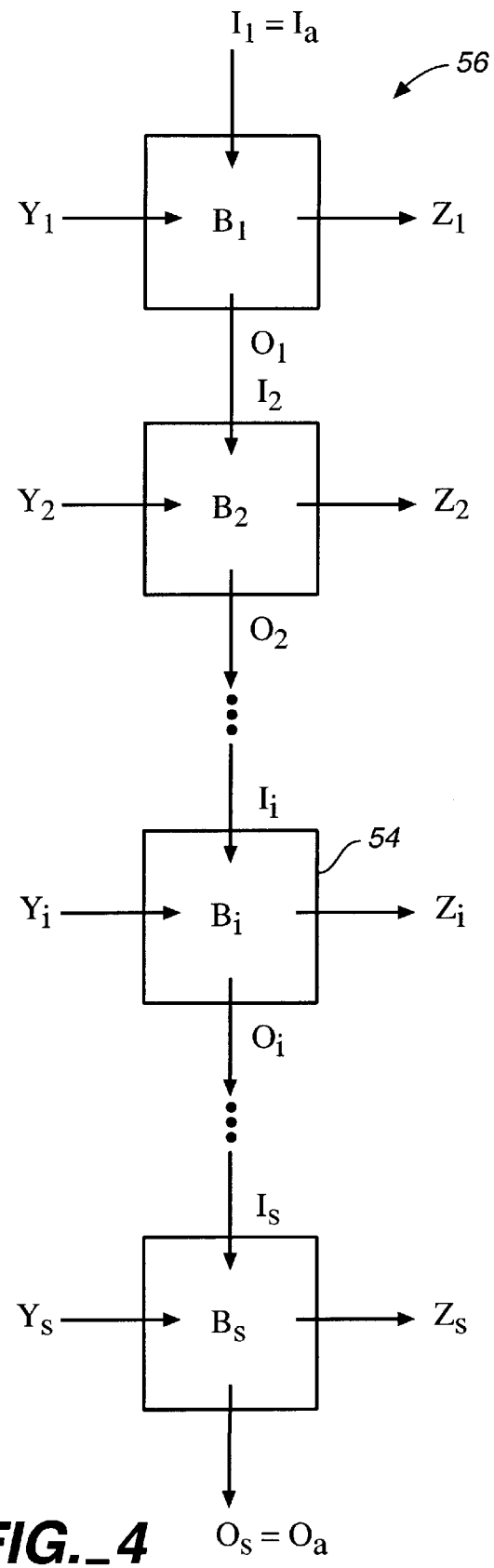
FIG._4

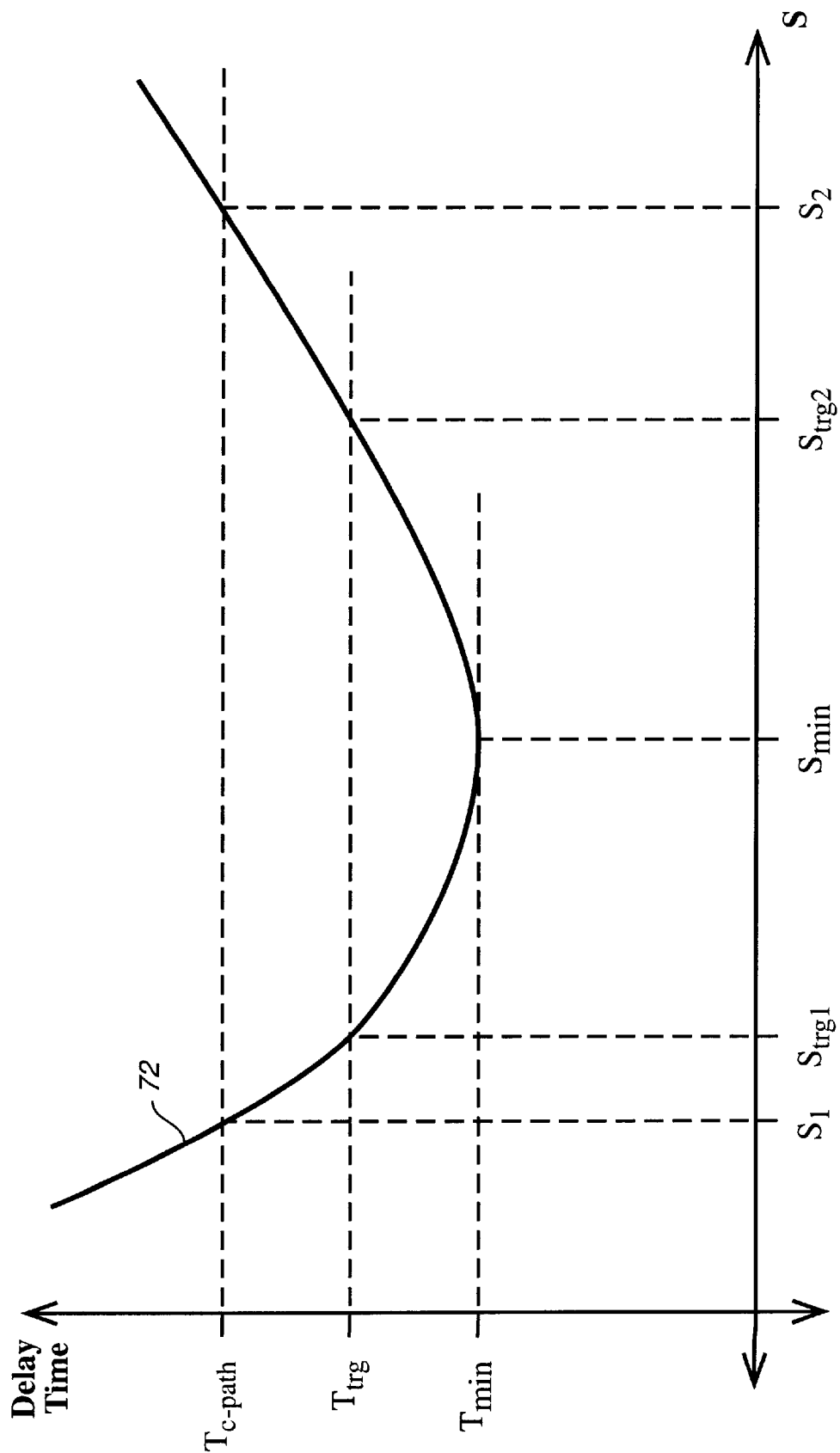
FIG._6

RESYNTHESIS METHOD FOR SIGNIFICANT DELAY REDUCTION

BACKGROUND OF THE INVENTION

1. Field of the Invention

The present invention generally relates to the art of microelectronic integrated circuits. In particular, the present invention relates to the art of improving the performance of integrated circuits.

2. Description of Related Art

An integrated circuit chip (hereafter referred to as an "IC" or a "chip") comprise cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip. For example, FIG. 1A shows a grossly simplified IC 10 having four cells 12, 14 16, and 18 and ten pins 22, 24, 26, 28, 30, 22, 34, 36, 38, and 40. For simplicity, the cells will be denoted $C_{nn}$ and the pins will be denoted p $_{nn}$ where nn is the reference number of the cell or the pin used in the figure.

A net is a set of two or more pins which must be connected. Because a typical chip has thousands, tens of thousands, or hundreds of thousands of pins, which must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins. Some nets may include hundreds of pins to be connected. The IC 10 of FIG. 1A has two nets. The first net is a two-pin net comprising pins $p_{34}$ and $p_{40}$. The second net is a three pin net comprising pins $p_{32}$, $p_{36}$, and $p_{38}$. A net can be denoted as a set of pins net $(p_1, p_2, \ldots p_n)$. A netlist is a list of nets for a chip.

Typically, an IC has a plurality of input pins and a plurality of output pins. The inputs are digital electrical signals being provided to the IC to be operated on. The outputs are digital electrical signals resulting from the operations of the IC. In between the input pins receiving the input signals to the IC and the output pins providing the output signals, the digital signals are operated on by a plurality of cells connected to each other. The connections of the cells are defined by the nets discussed hereinabove. The IC 10 of FIG. 1A has three input pins—$p_{22}$, $p_{24}$, and $p_{26}$—and two output pins—$p_{28}$ and $p_{30}$. For the purposes of describing the present invention, the pins of the IC which are neither input pins nor output pins will be referred to as intermediate pins.

One of the major constraints in design and fabrication of IC's is the time the IC requires to perform the specified function. This is often referred to as the performance of the IC. To determine the performance of an IC, various time measurements must to be considered. This is because, in addition to the input and output lines, the IC may include internal registers, or flip-flops, which may store certain output values and provide a portion of input values to the logic circuits. The performance of an IC may be defined as the period of time between the instant the last of the input signals are available to the logic circuit (whether the signals are from the input lines or from internal registers) to the instant the latest of the output signals are available from the logic circuit (whether the signals are for the output lines or for internal registers). The instant the input signal are applied is often denoted as to. In any event, the performance of the IC is the period of time required for the logic circuits of the IC to performs its designed function irrespective of whether the inputs to the logic circuits are from the input pins or from the flip-flops or the outputs from the logic circuits are to the output pins or to the flip-flops. The performance of the IC is also referred to as the delay of the IC, or the IC delay.

For example, if the inputs to the IC 10 of FIG. 1A is applied at time to and the last of the output signals of the IC is available at $t_0+3$ ns (nano-seconds), then the delay of the IC 10 is 3 ns. This is true even if the other outputs signals of the IC are available at $t_0+1$ ns or at $t_0+2$ ns.

The performance of the IC depends on many factors such as the physical characteristics of the material, the layout of the cells, etc. Some of these factors, such as the physical characteristics of the material of the IC, cannot be changed during the cell placement and routing process. On the other hand, the placement of the cells and the routing of the nets can be modified during the placement process to improve the performance of the IC.

In order to increase the performance of the IC by modifying the placement of the cells and re-routing the nets, the paths of the IC must be analyzed and the critical paths identified. A path is a set of pins and edges through which information travels. A critical path is the path or the paths among all possible paths of an IC which causes the highest delay of the IC.

An edge is the direction of signals flow through the cells and the wires. There are two types of edges in an IC. A cell edge is the direction of signals flow through the cells of an IC, and is obtained by "connecting" an input pin of a cell with an output pin of the same cell. If a cell takes an input signal at pin $p_i$ and produces and output signal at pin $p_o$, then the cell edge for that signal flow is denoted $e_c(p_i, p_o)$. Then, $p_i$ is called a parent of $p_o$ and $p_o$ a child of $p_i$. For example, the IC 10 of FIG. 1A has several cell edges. The cell edges are $e_c(p_{22}, p_{32})$, $e_c(p_{24}, p_{34})$, $e_c(p_{26}, p_{34})$, $e_c(p_{36}, p_{38})$, $e_c(p_{38}, p_{30})$, and $e_c(p_{40}, p_{30})$. A pin may have none (for an input pin), one, or many parent(s), and none (for an output pin), one or many children. An ancestor of p is any parent, grand-parent, or any pin within a path from an input pin to p, including the input pin but not including p.

A net edge is the direction of signal flow from an output pin of a cell to an input pin of another cell, and is obtained by connecting the driverpin of a net with sink pin, or a sink of the same net. A driverpin is the pin of a net which provides the signal to the sink pins of the same net and is typically an output pin of a cell. If a net has a driver pin $p_d$ which is connected to a sink pin $p_s$, then the net edge for that signal flow is denoted $e_n(p_d, p_s)$ A sink pin is a pin of a net which receives the signal from a driver pin, and is often an input pin of a cell. For example, the IC 10 of FIG. 1A has several net edges. The net edges are $e_n(p_{32}, p_{36})$, $e_n(p_{32}, p_{38})$, and $e_n(p_{34}, p_{40})$.

All edges of an IC are directed edges having a driver pin from which the signal originates and a sink pin to which the signal flows. For the purposes of the present invention, the distinction between the cell edges and net edges is not critical. Therefore an edge will mean a cell edge or a net edge, and will be denoted $e(p_p, p_c)$ to indicate an edge between a parent pin $p_p$ and a child pin $p_c$.

A path may be denoted as a set of pins and edges, for example, path($p_1$, e($p_1$, $p_2$), $p_2$, e($p_2$, $p_3$), $p_3$, . . . ). An alterative expression of the path is to merely list the nodes, for example, path($p_1$, $p_2$, . . . ). Yet another alterative expression of the path is to merely list the serially connected cells or the circuit components comprising the path, for example, path($cell_1$, $cell_2$, . . . ).

FIG. 1B illustrates a directed graph constructed from the pins and the edges of the IC 10 of FIG. 1A. Each node of the graph 50 correspond to a pin of the IC 10 of FIG. 1, and each edge of the graph 50 correspond to an edge of the same IC 10. In FIG. 1B, the edges are directed. That is, each of the edges is indicated by an arrow to show the direction of the signal flow. In the present specification, the terms pins and the nodes will be used interchangeably unless otherwise specified. The nodes of a directed timing graph represents the pins of the IC.

Because each of the edges of the directed graph 50 of FIG. 1B represents a signal travel through a cell or through a wire, each of the edges can be assigned an edge delay to indicate the time required for a signal to travel from the parent pin to the child pin. Then, the directed graph is referred to as a directed timing graph or merely a timing graph. The delay of e($p_1$, $p_2$) is denoted delay($p_1$, $p_2$). It takes time for electrical signal to travel from pin to pin; thus, every edge has a delay.

The paths of the timing graph of an IC can be analyzed to locate the critical paths. The timing characteristics of the cell edges can be obtained from libraries. However, the timing characteristics of net edges are not easily obtainable before the actual routing of the nets.

The period of time required for signals to travel from an input pin to pin p may be called the arrival time of pin p. For the purposes of analysis of an IC, all of the input signals of the IC is assumed to be available at the same time. The arrival time of node p, denoted arrival(p), is the latest time a signal from an input mode reaches the node through any available path from an input node to the node. Formally, arrival(p) is $$arrival(p) = \max_{i=1-k}(arrival(p_i) + delay(p_i, p))$$

where $k$ is the number of parents of $p$; and $p$ is a child of $p_i$;

$p_i$ is a parent of $p$; and arrival($p$) = 0 if $p$ is an input node.

To determine the performance, or the delay, of an IC, each of the paths of the IC must be analyzed. The IC delay may be expressed as the largest arrival time of any of the output nodes, or $$IC\,delay = \max_{j=1-m}(arrival(p_j))$$

where $m$ is the number of output pins of the $IC$;

$p_j$ is an output pin.

Thus, the performance of a entire chip is defined by the longest paths, or the critical paths of the chip.

A typical IC contains many thousands or even millions of pins and paths. However because the performance of the chip is defined by a relatively small number of critical paths, it is possible to improve the chip's performance by resynthesizing a small portion of the chip comprising the cells of the critical paths.

To improve the performance of the IC's, prior art techniques involve resynthesis of the circuit by modifying the critical paths and neighboring logic. However, such resynthesis techniques lack the methodology which can lead to predictable results in terms of delay reduction and area penalty. Another prior art technique involves reducing fanout of the nets on critical paths by adding buffers. However, in some situations, addition of buffers does not decrease the delay of the critical paths, especially if the critical paths contain long chains of cell each of which require addition of many buffers.

SUMMARY OF THE INVENTION

Therefore, an object of the present invention is to improve the performance of an IC by transforming critical paths to reduce the delay of the critical paths. To achieve the object of the invention, the present invention provides for a method and apparatus to improve performance of an IC by defining blocks, each block comprising one or more cells of the critical path and resynthesizing each of the blocks.

Resynthesis of a block is performed by replacing the block with three blocks (first, second, and third blocks) and a multiplexor. All inputs are provided to the first block, but only non-critical outputs are taken from the first block. Only non-critical inputs are provided to the second and the third blocks. A zero (0) is provided to the second block as its critical input and a one (1) is provided to the third block as its critical input.

The apparatus comprises processor and memory which contain the instructions for the processors to improve performance of an IC by defining blocks, and resynthesizing each of the blocks. The memory may be a machine-readable storage medium The present invention also provides for a device constructed according to the method or constructed by the apparatus discussed herein.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 1A is a simplified illustration of an integrated circuit chip;

FIG. 1B is a timing graph derived from the integrated circuit chip of FIG. 1A;

FIG. 2 is a simplified illustration of a critical path and the critical path cells on an integrated circuit chip;

FIG. 3 is an illustration of a block of cells having inputs, including a critical path input, and outputs, having a critical path output;

FIG. 4 is a diagram illustrating a critical path as defined by a series of blocks;

FIG. 5 illustrates a resynthesis circuit used to replace a block of cells;

FIG. 6 is a graph illustrating the relationship between the number of segments used to group the critical path cells and the delay time; and FIG. 7 is a simplified diagram illustrating an apparatus of the present invention.

DETAILED DESCRIPTION OF THE PREFERRED EMBODIMENT(S)

Referring to FIG. 2, an IC having a critical path from input $I_a$ to output $O_a$ through cells $C_1, C_2, \ldots C_N$ is illustrated. For simplicity, FIG. 2 does not show numerous other cells and paths also comprising the IC 50. Each of the cells may have one or more inputs and one of more outputs, each output fanning out to one or more sinks. Also, because the cells of the path($C_1, C_2, \ldots C_N$) define a critical path, each of the cells has one input which is a part of the critical path and one output which is a part of the critical path.

The N cells of the critical path path($C_1, C_2, \ldots C_N$) are divided into S blocks, or S segments, each block comprising one or more cells of the critical path, and where $1 \leq S \leq N$. Because each cell may have one or more inputs and one or more outputs, each block of cells also has one or more inputs and one or more outputs. Also, because a block comprise cells of the critical path, each block has a critical path input and a critical path output.

FIG. 3 illustrates a block 52 of cells having multiple inputs, I and Y, and multiple outputs, O and Z. For simplicity, the critical input to a block will be denoted with an I and all other inputs denoted with a Y. Similarly, the critical output from a block will be denoted with an O and all other outputs denoted with a Z.

FIG. 4 illustrates a set of blocks $B_1, B_2, \ldots, B_i, \ldots B_S$ representing the critical path path($C_1, C_2, \ldots C_N$) from $I_a$ to $O_a$. Because $I_a$ is the input to the first block, $B_1$, it is also referred to as $I_1$, and because $O_a$ is the output of the last block, $B_S$, it is also referred to as $O_S$. For any particular block, $B_i$, the critical path input is denoted $I_i$, all other inputs (non-critical path inputs) are denoted $Y_i$, the critical path output is denoted $O_i$, and all other outputs (non-critical path outputs) are denoted $Z_i$. Note that the critical output of a block $O_i$ is also the critical input of the next block, $I_{i+1}$.

Each of the blocks of the critical path is replaced by a resynthesized circuit illustrated by FIG. 5. FIG. 5 illustrates the resynthesized circuit 60 replacing block $B_i$ where i is each of the blocks $B_1, B_2, \ldots, B_S$ representing the critical path path($C_1, C_2, \ldots C_N$) from $I_a$ to $O_a$. In this example, let $B_i$, be the $B_i$ 54 of FIG. 4. Then, the outputs of $B_i$ 54 can be expressesed as some function of the inputs. That is, $B_i$ 54 operates on the inputs, $Y_i$ and $I_i$, to produce the outputs; thus, the value of the outputs, $Z_i$ and $O_i$, depends up on the value of the inputs, $Y_i$ and $I_i$. Formally expressed, $Z_i = F_z(Y_i, I_i)$ where $F_z$ represents the operations of $B_i$ on $Y_i$ and $I_i$ to produce $Z_i$; and $O_i = F_o(Y_i, I_i)$ where $F_o$ represents the operations of $B_i$ on $Y_i$ and $I_i$ to produce $O_i$.

Also, the delay of $B_i$ to produce each of the outputs can be expressed as $T_z$ the period of time required to perform $F_z$; and $T_i$ the period of time required to perform $F_o$ for block i.

Then, the critical path delay value for the entire critical path 56 of FIG. 4, or critical path($I_a, O_a$) of FIG. 2, is the sum of delays of each of the blocks, or $$T_{critical\text{-}path} = IC \text{ delay} = \sum_{i=1 \text{ to } S} T_i = T_{c\text{-}path}$$

Assuming that the cells of the critical path have been grouped into S blocks having equal delays, $$T_{c\text{-}path} = ST_i;$$

and $$T_i = T_{c\text{-}path}/S$$

where S is the number of blocks, or groups, the cells of the critical path have been grouped into blocks.

The ultimate goal of replacing the blocks of cells of the critical path with resynthesized circuits is to reduce the delay of the critical path, the IC delay. Using the above-described notation scheme, then, the goal of the present invention is to reduce delay $T_i$, not necessarily $T_z$, because $T_i$, not $T_z$, contributes to the critical path.

Referring to FIGS. 4 and 5, the resynthesized circuit 60 comprises a first block 62, a second block 64, a third block 66, and a multiplexor 68. In the simplest implementation, the three blocks of cells, blocks 62, 64, and 66, are identical to each other and identical to the original block of cells, $B_i$ 54, that the resynthesized circuit 60 is replacing. The first block 62 may be the original block, the second block 64 may also be referred to as the first copy of the original block, and the third block 66 may also be referred to as the second copy of the original block.

Each of the three blocks are provided with all of the non-critical path inputs, $Y_i$, of $B_i$ 54. The critical input, $I_i$, is provided only to the first block 62 and to the multiplexor 68. The second block 64 is provided, as its critical input, a first digital value—a zero (0) in this example. The third block 66 is provided, as its critical input, a second digital value—a one (1) in this example.

As for the outputs, all non-critical path outputs, $Z_i$, are taken from the first block 62 to be provided to the other cells. The non-critical path outputs, $Z_i$, are not required from the second block 64 and the third blocks 66. Only the critical path outputs are required from the second block 64 and the third block 66.

The second block's critical path output, $O_{i2}$, and the third block's critical path output, $O_{i3}$, is fed into a multiplexor (MUX) 68. Then, using the critical input $I_i$, the output $O_i$ is selected from $O_{i2}$ or $O_{i3}$.

Three blocks 62, 64, and 66 of the resynthesized circuit 60 are, at worst, exact duplicates of the block i, $B_i$ 54, that the resynthesized circuit 60 is replacing. Therefore, each of the three blocks have, at worst, the same timing characteristics as the original block And, the three blocks operate simultaneously. Therefore, the period of time required by the resynthesized circuit, denoted $T_{inew}$, is, at worst, equal to $T_i$. However, because each of the blocks 62, 64, and 66, of the resynthesized circuit 60, are required to perform less functions than the original block 54, each of the three blocks 62, 64, and 66, may be reduced leading to smaller $T_{inew}$. Formally expressed, $$T_{inew} \leq T_i$$

Then, for each resynthesis circuit, the delay is $$T_{resynthesis\ circuit\ i} = T_{inew} + T_{mux}$$

where $T_{mux}$ is the delay of the MUX 68.

Typically, $T_{mux}$ is much smaller than $T_i$ or $T_{inew}$ because the multiplexor 68 is merely a single switch. Formally, this is expressed $$T_{mux} \ll T_i;$$

and $$T_{mux} \ll T_{inew}.$$

Replacement of $T_i$ with $T_{resynthesis\ circuit\ i}$ for any block i, $B_i$, does not appear to be a great gain in performance, particularly in view of the fact that $T_{resynthesis\ circuit\ i}$ must include the MUX delay $T_{mux}$. However, the most of the gain in performance (reduction of the critical path delay) is realized when each of the blocks of the entire critical path circuit is replaced with resynthesized circuits.

Before the replacement of the cell blocks by the resynthesized circuits, the critical path delay is the sum of delays of each of the blocks, or $$T_{c\text{-}path} = \sum_{i=1\ to\ S} T_i$$

Assuming that the cells of the critical path have been grouped into S blocks having equal delays, $$T_{c\text{-}path} = ST_i;$$

and $$T_i = T_{c\text{-}path}/S;$$

where S is the number of blocks, or groups, the cells of the critical path.

After the replacement of the cell blocks by the resynthesized circuits, the new critical path delay becomes the sum of the MUX delays plus the maximum $T_{inew}$ delay of any one of the blocks. Formally, $$T_{new\ critical\ path\ delay} = \max(T_{inew}) + ST_{mux} = T_{new\ c\text{-}path}$$

Because $T_{mux}$ is much smaller than $T_i$, $ST_{mux}$ is much smaller than $ST_i$. The addition of a single $T_{inew}$ value does not overcome the difference between $ST_i$ and $ST_{mux}$.

Also, given that $$T_i = T_{c\text{-}path}/S$$

Sand that $$T_{inew} \leq T_i$$

the new critical path delay can be rewritten $$T_{new\ c\text{-}path} = T_{c\text{-}path}/S + ST_{mux}$$

The above relationships can be expressed as the following equation:

$$S^2 T_{mux} - ST_{new\ c\text{-}path} + T_{c\text{-}path} = 0$$

Then, the number of segments, S, that produce the minimum delay in the transformed path is:

$$S_{min} = m^{1/2}; \text{ where } m = T_{c\text{-}path}/T_{mux}$$

And, the minimum delay possible for the transformed, or resynthesized, path is $$T_{min} \leq T_{c\text{-}path}/(m^{1/2}/2) = 2(T_{c\text{-}path} * T_{mux})^{1/2};$$

where $m = T_{c\text{-}path}/T_{mux}$

Because $T_{mux}$ is very small compared to $T_{c\text{-}path}$, $T_{min}$ is much smaller than the original $T_{c\text{-}path}$.

Moreover, delays along other paths of the circuit, following the paths of the outputs $Z_i$, will not increase. In fact, it is likely that the delays along other paths of the circuit will decrease because the delays through the blocks with one input fixed at 0 or 1 will be lower than the delays through original blocks.

Because of the replacement of the cell blocks with resynthesized circuits, the complexity of the IC is increased. Let K be the complexity of the original critical path circuits;

K1 complexity of all the first blocks of the transformed path;

K2 complexity of all the second blocks of the transformed path;

K3 complexity of all the third blocks of the transformed path; and

Kmux complexity of all the multiplexors blocks of the transformed path.

The total complexity of the transformed circuit is K1+K2+K3+Kmux. However, as discussed, each of the blocks of the resynthesized circuits are likely to be simpler and smaller than the original cell block, and the multiplexors are mere switches. Accordingly, the complexity of the transformed circuit, for practical purposes, is no more than 3K. Alternatively expressed,

K1≤K;

K2≤K;

K3≤K; and

Kmux<<K.

Therefore,

K1+K2+K3+Kmux≤3K.

The area penalty will be negligible if the number of paths transformed is not large compared to the number of the circuits and paths in the entire IC.

Critical path circuits do not need to be transformed to realize the absolutely minimum delay. Rather, in most cases, the goal of the transformation will be to reduce the delay of critical path circuits to some target delay, $T_{trg}$, which is close to the delay of other paths in the circuit.

FIG. 6 illustrates the relationship between S, the number of blocks into which the cells of the critical paths are grouped, and the delay time T. In FIG. 6, the horizontal axis (traditionally, the x-axis) represents S and will be denoted S-axis, and the vertical axis (traditionally, the y-axis) represents the delay period T and will be denoted T-axis. The curve 72 represents the relationship between S and T.

It can be shown that the relationship between S and T at $T_{c\text{-}path}$ is $$S_1 = (m - (m(m-4))^{1/2})/2;$$

and $$S_2 = (m + (m(m-4))^{1/2})/2;$$

where $m = T_{c\text{-}path}/T_{mux}$.

Then, any value of S greater than $S_1$ but less than $S_2$ will reduce the delay time. This fact allows for the selection of S which will reduce the critical path delay while minimizing the additional complexity and area requirement.

For any given target delay $T_{trg}$, the two available S values for the target delay are:

$$S_{trg1}=((mT_{trg}/T_{c\text{-}path})-(m(m(T_{trg}/T_{c\text{-}path})^2-4))^{1/2})/2;$$

and $$S_{trg2}=((mT_{trg}/T_{c\text{-}path})+(m(m(T_{trg}/T_{c\text{-}path})^2-4))^{1/2})/2;$$

where $m=T_{c\text{-}path}/T_{mux}$.

Then, any value of S greater than $S_{trg1}$ but less than $S_{trg2}$ will reduce the delay time and meet the $T_{trg}$ requirement. This fact also allows for the selection of S which will reduce the critical path delay while minimizing the additional complexity and area requirement. In practice, it appears that good solution can be found by beginning with the $S_{trg1}$ segments and increasing it as needed to minimize the area penalty.

The present invention also includes an integrated circuit having cells and critical paths where the performance of the integrated circuit is or have been increased by the methods described hereinabove.

Now referring to FIG. 7, a computing apparatus 74 for improving performance of an IC is illustrated. The apparatus comprises a processor 76 and memory 78 connected to the processor 76. The memory 78 stores computer encoded instructions for the processor 76 to read input information 80, transform critical path circuits, and produced, as output 82, a description of the transformed circuit. The transformation of the circuits are performed using the methods discussed hereinabove.

The memory 78 may be any kind of machine-readable storage medium containing the instructions for the processor 76. It is well known in the art that the memory may be formed as a semiconductor memory device, magnetic device, optical device, magneto-optical device, floppy diskette, hard drive, CD-ROM, magnetic tape, computer memory, or memory card.

Although the present invention has been described in detail with regarding the exemplary embodiments and drawings thereof, it should be apparent to those skilled in the art that various adaptations and modifications of the present invention may be accomplishes without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A method of improving performance of an integrated circuit having critical paths of cells, each cell having one or more inputs, including a critical path input, and one or more outputs, including a critical path output, said method comprising the steps of:

defining blocks, each defined block comprising one or more cells of the critical path and having a critical input and a critical output, wherein said step of defining blocks comprises the step of segmenting the critical path cells into groups of cells;

transforming said defined blocks to decrease delay of the critical path;

wherein said step of segmenting the critical path cells comprises the steps of:
(1) determining a target delay, $T_{trg}$; and
(2) determining a first segmentation value (S value) into which the critical path cells will be divided, wherein said first segmentation value, $S_{trg1}$, is $$S_{trg1}=((mT_{trg}/T_{c\text{-}path})-(m(m(T_{trg}/T_{c\text{-}path})^2-4))^{1/2})/2$$

where $T_{trg}$ is said target delay;

$T_{c\text{-}path}$ is the delay of the critical path; and m is $T_{c\text{-}path}/T_{mux}$ where $T_{mux}$ is the delay of a multiplexor used in said step of transforming each of said defined blocks.

2. A method of improving Performance of an integrated circuit having critical paths of cells, each cell having one or more inputs, including a critical path input, and one or more outputs, including a critical path output, said method comprising the steps of:

defining blocks, each defined block comprising one or more cells of the critical path and having a critical input and a critical output, wherein said step of defining blocks comprises the step of segmenting the critical path cells into groups of cells;

transforming said defined blocks to decrease delay of the critical path;

wherein said step of segmenting the critical path cells comprises the steps of:
(1) determining a target delay, $T_{trg}$; and
(2) determining a first segmentation value (S value) into which the critical path cells will be divided, wherein said first segmentation value, $S_{trg2}$, is $$S_{trg2}=((mT_{trg}/T_{c\text{-}path})+(m(m(T_{trg}/T_{c\text{-}path})^2-4))^{1/2})/2$$

where $T_{trg}$ is said target delay;

$T_{c\text{-}path}$ is the delay of the critical path; and m is $T_{c\text{-}path}/T_{mux}$ where $T_{mux}$ is the delay of a multiplexor used in said step of transforming each of said defined blocks.

3. A method of improving performance of an integrated circuit having critical paths of cells, each cell having one or more inputs, including a critical path input, and one or more outputs, including a critical path output, said method comprising the steps of:

defining blocks, each defined block comprising one or more cells of the critical path and having a critical input and a critical output, wherein said step of defining blocks comprises the step of segmenting the critical path cells into groups of cells;

transforming said defined blocks to decrease delay of the critical path wherein said step of transforming comprises the step of resynthesizing each of said defined blocks, wherein said step of resynthesizing said defined block comprises the steps of:

replacing said defined block with a first block, a second block, a third block, and a multiplexor;

inputting, to said first block, all the inputs of said defined block;

inputting, to said second block and to said third block, all the inputs of said defined block except the critical path input;

inputting to said second block a first digital value as the critical path input;

inputting to said third block a second digital value as the critical path input; and inputting, to said multiplexor, the critical path output from said second block, the critical path output from said third block, and the critical path input of said defined block.

4. A method according to claim 3 wherein said first block is identical to said defined block being replaced.

5. A method according to claim 3 wherein said first block is a reduced version of said defined block being replaced.

6. A method according to claim 3 wherein said second block is identical to said defined block being replaced.

7. A method according to claim 3 wherein said third block is identical to said defined block being replaced.

8. A method of improving performance of an integrated circuit having critical paths of cells, each cell having one or more inputs including a critical path input and one or more outputs including a critical path output, said method comprising the steps of:

defining a block, said defined block comprising one or more selected cells of the critical path thereby having a critical path input and a critical path output;

constructing a first copy and a second copy of said defined block; and selecting, as the critical path output of said defined block, output from a group consisting of critical path output of said first copy and critical path output of said second copy.

9. A method according to claim 8 wherein said step of selecting is performed using a multiplexor.

10. A method of improving performance of an integrated circuit having critical paths of cells, each cell having one or more inputs and one or more outputs, said method comprising the steps of:

defining a block, said defined block comprising one or more selected cells of the critical path;

identifying a critical path input and a critical path output of said defined block;

constructing a first copy and a second copy of said defined block;

providing all inputs of said selected cells to said first copy except said critical path input;

providing, to said first copy, a first digital value as the critical path input;

providing all inputs of said selected cells to said second copy except said critical path input;

providing, to said second copy, a second digital value as the critical path input; and selecting, as the critical path output of said defined block, output from a group consisting of critical path output of said first copy and critical path output of said second copy.

11. An integrated circuit having critical paths of cells, each cell having one or more inputs and one or more outputs, wherein performance of the integrated circuit is improved by the steps of:

defining a block, said defined block comprising one or more selected cells of the critical path;

identifying a critical path input and a critical path output of said defined block;

constructing a first copy and a second copy of said defined block; and selecting, as the critical path output of said defined block, output from a group consisting of critical path output of said first copy and critical path output of said second copy.

12. An integrated circuit having critical paths of cells, each cell having one or more inputs and one or more outputs, wherein performance of the integrated circuit is improved by the steps of:

defining a block, said block comprising one or more selected cells of the critical path thereby having a critical path input and a critical path output;

constructing a first copy and a second copy of said defined block; and selecting, as the critical path output of said defined block, output from a group consisting of critical path output of said first copy and critical path output of said second copy.

13. An apparatus for improving performance of an integrated circuit having critical paths of cells, each cell having one or more inputs and one or more outputs, said apparatus comprising:

means for defining a block, said defined block comprising one or more selected cells of the critical path thereby having a critical path input and a critical path output;

means for constructing a first copy and a second copy of said defined block; and means for selecting, as the critical path output of said defined block, output from a group consisting of critical path output of said first copy and critical path output of said second copy.

14. An apparatus for improving performance of an integrated circuit having critical paths of cells, each cell having one or more inputs and one or more outputs, said apparatus comprising:

means for defining a block, said defined block comprising one or more selected cells of the critical path;

means for identifying a critical path input and a critical path output of said defined block;

means for constructing a first copy and a second copy of said defined block;

means for providing all inputs of said selected cells to said first copy except said critical path input;

means for providing, to said first copy, a first digital value as the critical path input;

means for providing all inputs of said selected cells to said second copy except said critical path input;

means for providing, to said second copy, a second digital value as the critical path input; and means for selecting, as the critical path output of said defined block, output from a group consisting of critical path output of said first copy and critical path output of said second copy.

15. An apparatus for improving performance of an integrated circuit having critical paths of cells, each cell having one or more inputs and one or more outputs, said apparatus comprising:

a processor;

memory connected to said processor, said memory having instructions for said processors to:

define a block, said block comprising one or more selected cells of the critical path;

identify a critical path input and a critical path output of said defined block;

construct a first copy and a second copy of said defined block;

select, as the critical path output of said defined block, output from a group consisting of critical path output of said first copy and critical path output of said second copy.

16. A machine-readable storage medium containing instructions for a computer to improve the performance of an integrated circuit having critical paths of cells, each cell having one or more inputs and one or more outputs comprising:

an encoded instruction on said storage medium for defining a block, said block comprising one or more selected cells of the critical path;

an encoded instruction on said storage medium for identifying a critical path input and a critical path output of said defined block;

an encoded instruction on said storage medium for constructing a first copy and a second copy of said defined block;

an encoded instruction on said storage medium for selecting, as the critical path output of said defined block, output from a group consisting of critical path output of said first copy and critical path output of said second copy.

17. A storage medium according to claim 16 wherein said storage medium is selected from a group consisting of semiconductor memory device, magnetic device, optical device magneto-optical device, floppy diskette, hard drive, CD-ROM, magnetic tape, compute memory, and memory card.

* * * * *